United States Patent
Kita

(10) Patent No.: US 10,594,122 B2
(45) Date of Patent: Mar. 17, 2020

(54) CIRCUIT BOARD AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventor: Yukinori Kita, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/314,974

(22) PCT Filed: Jun. 16, 2017

(86) PCT No.: PCT/JP2017/022290
§ 371 (c)(1),
(2) Date: Jan. 3, 2019

(87) PCT Pub. No.: WO2018/008362
PCT Pub. Date: Jan. 11, 2018

(65) Prior Publication Data
US 2019/0326738 A1    Oct. 24, 2019

(30) Foreign Application Priority Data
Jul. 7, 2016    (JP) .................... 2016-134791

(51) Int. Cl.
*H02G 3/16*    (2006.01)
*H02G 3/03*    (2006.01)
(Continued)

(52) U.S. Cl.
CPC .............. *H02G 3/16* (2013.01); *H02G 3/03* (2013.01); *H05K 1/183* (2013.01); *H05K 3/20* (2013.01);
(Continued)

(58) Field of Classification Search
None
See application file for complete search history.

(56) References Cited

U.S. PATENT DOCUMENTS 6,570,773 B1*    5/2003    Loibl ................. B60R 16/0239
                                                        361/748
7,749,134 B2*    7/2010    Wetzel ............... B60R 16/0239
                                                        361/749
(Continued)

FOREIGN PATENT DOCUMENTS

JP    H7-235756 A    9/1995
JP    2004-007010 A    1/2004
(Continued)

OTHER PUBLICATIONS

International Search Report, Application No. PCT/JP2017/022290, dated Aug. 29, 2017.

*Primary Examiner* — Xanthia C Cunningham
(74) *Attorney, Agent, or Firm* — Honigman LLP

(57) ABSTRACT

A circuit board includes: a bus bar; a first prepreg that is overlaid on the bus bar; and a sheet-like leakage prevention portion that is overlaid on the surface of the first prepreg and suppresses leakage of the first prepreg to the outside.

7 Claims, 3 Drawing Sheets

(51) Int. Cl.
*H05K 1/18* (2006.01)
*H05K 3/20* (2006.01)
*H05K 3/34* (2006.01)
*B60K 6/22* (2007.10)
*B60R 16/023* (2006.01)

(52) U.S. Cl.
CPC ............... *H05K 3/34* (2013.01); *B60K 6/22* (2013.01); *B60R 16/0238* (2013.01); *B60Y 2200/91* (2013.01); *B60Y 2200/92* (2013.01); *H05K 2201/10053* (2013.01); *H05K 2201/10166* (2013.01); *H05K 2201/10272* (2013.01)

(56) References Cited

U.S. PATENT DOCUMENTS 8,254,126 B2 * 8/2012 Uejima ............... H01L 23/36
165/185

2004/0004818 A1 * 1/2004 Kawakita ............... H05K 5/062
361/704
2007/0107932 A1 * 5/2007 Jauniskis ............... H01L 23/04
174/260
2010/0065307 A1 * 3/2010 Nagase ............... H05K 1/021
174/252
2010/0165601 A1 * 7/2010 Yoon ............... G02F 1/133603
362/97.1
2014/0226296 A1 * 8/2014 Asano ............... H05K 1/0265
361/767
2016/0165715 A1 * 6/2016 Kahrimanovic ..... H05K 1/0203
361/709

FOREIGN PATENT DOCUMENTS

| | | |
|---|---|---|
| JP | 2013-058642 A | 3/2013 |
| JP | 2015-046479 A | 3/2015 |
| JP | 2015-099834 A | 5/2015 |

* cited by examiner

CIRCUIT BOARD AND ELECTRICAL JUNCTION BOX

CROSS-REFERENCE TO RELATED APPLICATIONS

This application is the U.S. national stage of PCT/JP2017/022290 filed Jun. 16, 2017, which claims priority of Japanese Patent Application No. JP 2016-134791 filed Jul. 7, 2016.

TECHNICAL FIELD

This specification discloses a technique relating to a circuit board and an electrical junction box.

BACKGROUND

Conventionally, a circuit assembly including a circuit board and a heat dissipation member has been known. The circuit assembly disclosed in JP 2003-164039A includes a bus bar and a heat dissipation member made of an aluminum-based metal or the like and having excellent thermal conductivity, and the bus bar is adhered to the heat dissipation member side by an adhesive.

Here, in the configuration disclosed in JP 2003-164039A, because an adhesive that is brought into direct contact with the bus bar is needed to adhere the bus bar, there is a problem in that the manufacturing cost increases.

The technique disclosed in this specification has been completed based on the above circumstances, and aims to reduce the manufacturing costs of a circuit board and an electrical junction box.

SUMMARY

A circuit board disclosed in this specification includes: a bus bar; a first prepreg that is overlaid on the bus bar; a sheet-like leakage prevention portion that is overlaid on the surface of the first prepreg and suppresses leakage of the first prepreg to the outside.

With this configuration, because a circuit board can be formed using, in place of an adhesive, a prepreg that is generally inexpensive and is insulating, the manufacturing cost can be reduced. Here, if a prepreg is used in place of an adhesive, due to the semi-curing nature of the prepreg, leakage of the resin or the like constituting the prepreg to the outside is of concern. According to this configuration, by the sheet-like leakage prevention portion being overlaid on the surface of the prepreg, the leakage of the prepreg to the outside can be suppressed. Accordingly, defects due to the leakage of the prepreg can be suppressed while reducing the manufacturing cost.

The following embodiments are preferred as embodiments of the technique disclosed in this specification.

The leakage prevention portion may be overlaid on the surface of the first prepreg opposite to the bus bar side.

In this manner, it is possible to suppress leakage of the first prepreg in a wide region where leakage of the first prepreg easily occurs.

The circuit board may include; an insulating substrate that is overlaid on the bus bar and has a conduction path; and a second prepreg for joining the insulating substrate and the bus bar.

In this manner, by joining the bus bar and the insulating substrate using the second prepreg, because the circuit board can be manufactured using the same kind of prepreg for the first prepreg and the second prepreg, the number of types of components can be reduced and the manufacturing cost can be reduced.

The leakage of the first prepreg to the outside may be a dripping of a semi-liquid resin constituting the first prepreg.

An electrical junction box may include; the circuit board; and a case for accommodating the circuit board.

Advantageous Effects of Disclosure

With the technique disclosed in this specification, the manufacturing costs of the circuit board and the electrical junction box can be reduced.

DETAILED DESCRIPTION OF PREFERRED EMBODIMENTS

An embodiment will be described with reference to FIGS. 1 to 4.

An electrical junction box 10 is installed in vehicles such as electric cars and hybrid cars. The electrical junction box 10 is arranged, for example, in the power supply path between a power supply, such as a battery of a vehicle, and a load constituted by e.g. a lamp, a windshield wiper, or a motor, and can be used for a DC-DC converter, an inverter, or the like. In the following description, it is assumed that the X direction is rightward and the Y direction is upward.

Electrical Junction Box 10

Figure 1:
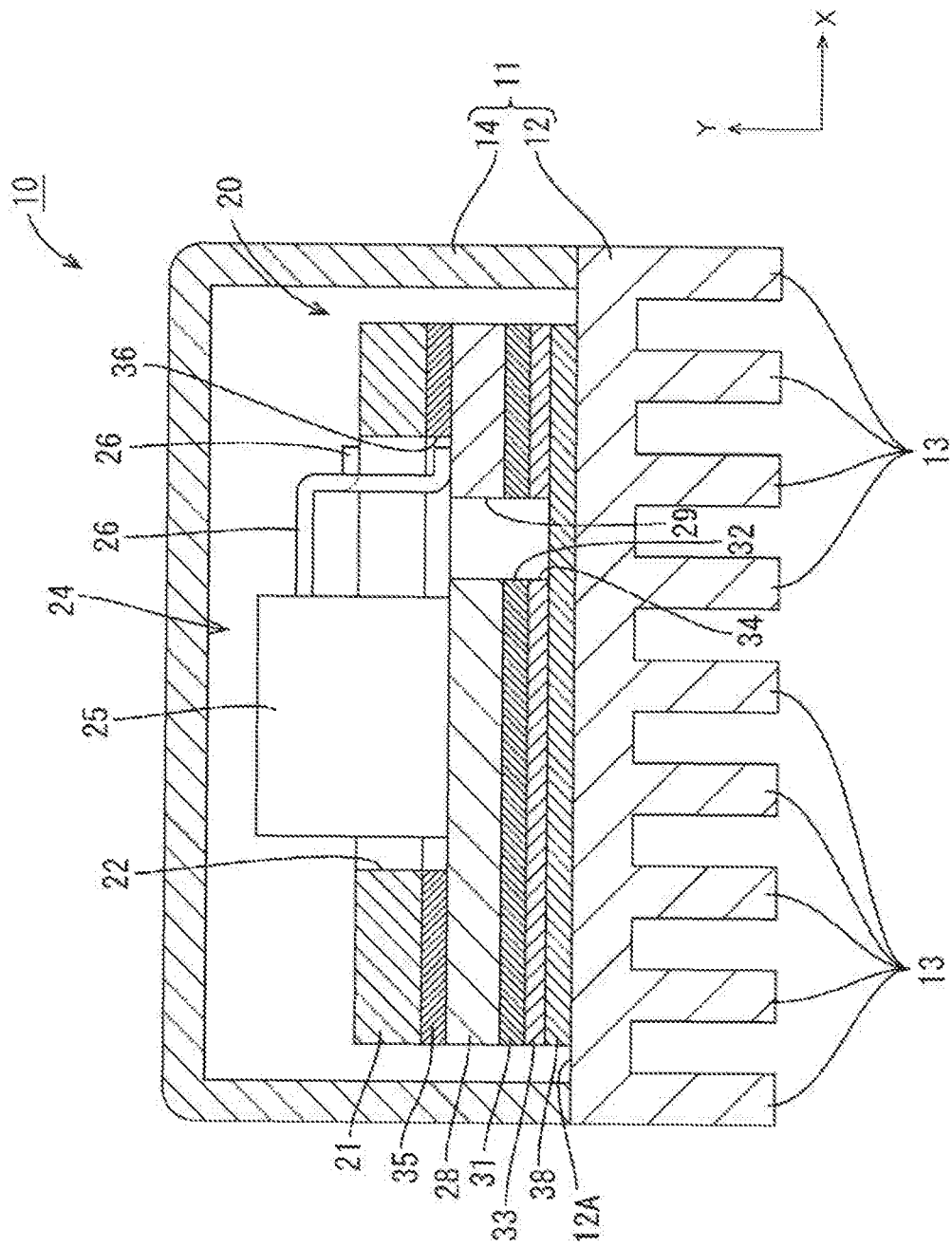
FIG. 1 is a longitudinal section view showing an electrical junction box of an embodiment.
Figure 2:
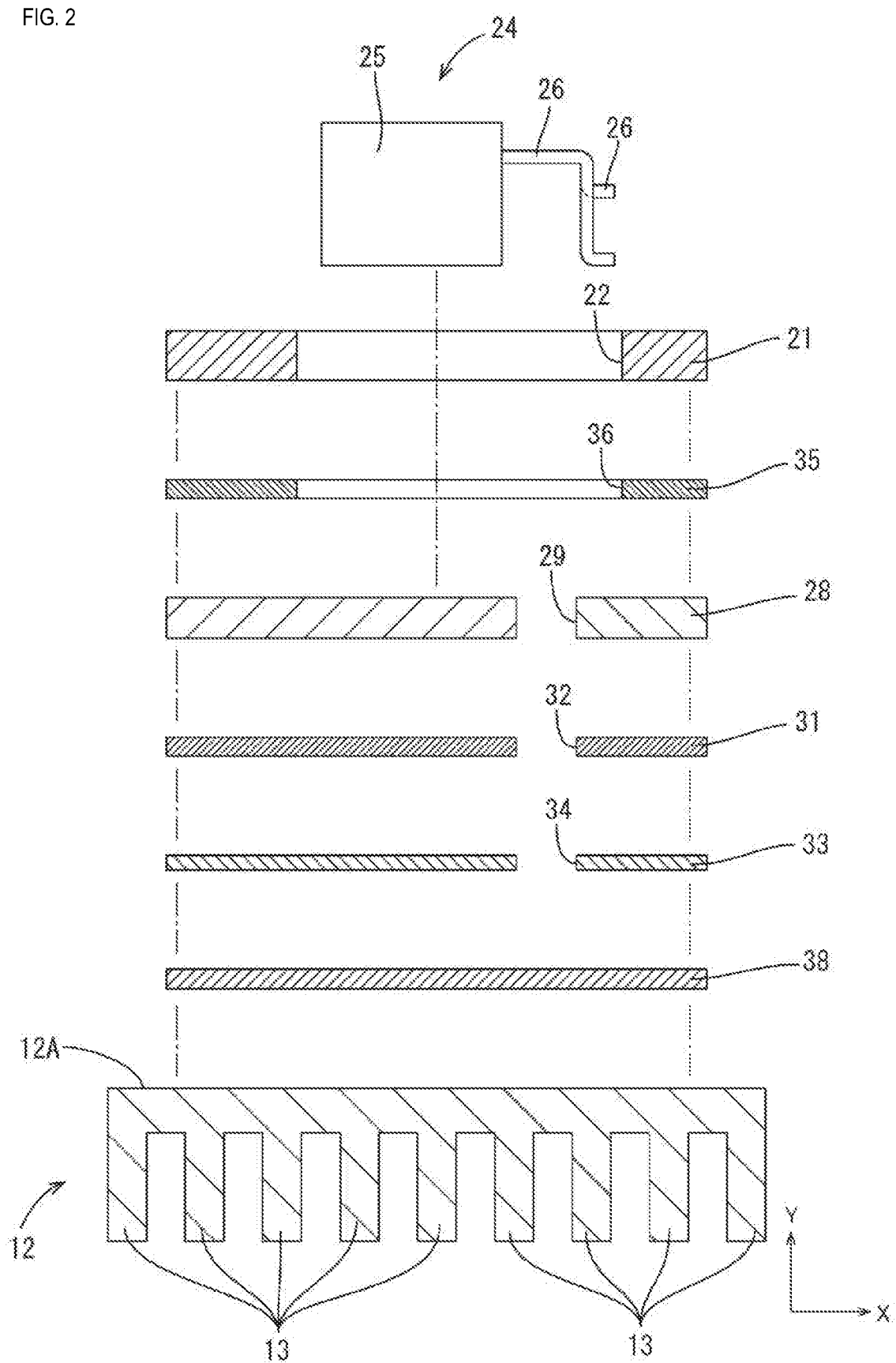
FIG. 2 is an exploded view of the electrical junction box.

As shown in FIG. 1, the electrical junction box 10 includes a circuit board 20 and a case 11 for accommodating the circuit board 20.

Case 11

The case 11 includes a heat dissipation member 12 and a cover 14 that covers the upper side of the circuit board 20. The heat dissipation member 12 is made of a metal material having high thermal conductivity such as aluminum, aluminum alloy, or the like. The heat dissipation member 12 has a flat upper surface 12A on which the circuit board 20 can be placed, and has multiple radiation fins 13 that are lined up like comb teeth on the bottom surface side. The cover 14 is made of synthetic resin or metal, and has a box shape whose lower side is open. Note, that the cover 14 is fixed to the heat dissipation member 12 with screws (not shown).

Circuit Board 20

Figure 4:
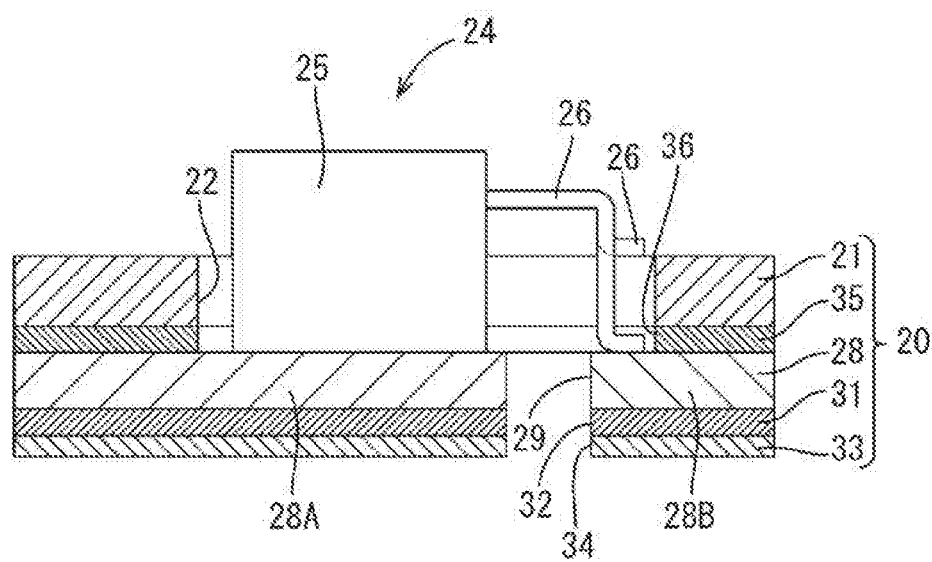
FIG. 4 is a longitudinal section view showing the circuit board on which an electronic component is mounted.

The circuit board 20 has a rectangular plate shape. As shown in FIG. 4, the circuit board 20 includes: an insulating substrate 21 having a conduction path; a second prepreg 35 that is overlaid (placed) on the lower surface of the insulating substrate 21 (one surface of the insulating substrate 21); a bus bar 28 that is overlaid on the lower surface of the second prepreg 35 (the surface of the second prepreg 35 opposite to the insulating substrate 21); a first prepreg 31 that is overlaid on the lower surface of the bus bar 28 (the surface of the bus bar 28 opposite to the second prepreg 35); and a sheet-like leakage prevention portion 33 that is overlaid on the lower surface of the first prepreg 31 (the surface of the first prepreg 31 opposite to the bus bar 28).

On the insulating substrate 21, a conduction path (not shown) made of copper foil or the like is formed on an insulating plate (e.g., both upper and lower surfaces of the insulating plate) by a printed wiring technique. Also, an insertion hole 22 through which an electronic component 24 is inserted passes through the insulating substrate 21. The electronic component 24 is constituted by a switching element (e.g., a relay such as a mechanical relay and an FET (Field Effect Transistor)), and has a box-shaped main body 25 and lead terminals 26. The main body 25 has a rectangular parallelepiped shape. Also, a lead terminal (not shown) that is electrically connected to the bus bar 28 is arranged on the lower side of the main body 25, and multiple lead terminals 26 protrude laterally from the side surface of the main body 25. The multiple lead terminals 26 are respectively connected to the conduction path on the upper surface of the insulating substrate 21 and the bus bar 28 by, for example, reflow soldering.

The bus bar 28 is made of metal such as copper, copper alloy, aluminum, aluminum alloy, or the like, and multiple metal plates 28A and 28B that are formed by punching out a metal plate material according to the shape of the conduction path are arranged on the same plane. Because the adjacent metal plates 28A and 28B are arranged with a gap therebetween, the adjacent metal plates 28A and 28B are insulated by a groove portion 29 (opening portion) extending in the front-rear direction.

The first prepreg 31 and the second prepreg 35 are, for example, reinforced plastic materials in which a thermosetting resin such as an epoxy resin mixed with a curing agent or the like is uniformly impregnated into a fibrous reinforcing material such as glass cloth and carbon fiber, and are reinforced plastic materials that are heated or dried to a semi-cured state. The semi-cured state prepreg is not limited to a prepreg having no adhesiveness and may have adhesiveness. In this embodiment, like prepregs that have the same size but have different shapes (the shapes of the groove portion 32 and an insertion hole 36) are used for the first prepreg 31 and the second prepreg 35.

The prepregs can be used by being processed into a predetermined size (shape).

The first prepreg 31 has a constant thickness, and, in a semi-cured state, is in intimate contact with the entire lower surface of the bus bar 28 (the surface opposite to the insulating substrate 21 side). A groove portion 32 (opening portion) corresponding to the position of the groove portion 29 (opening portion) of the bus bar 28 is formed and passes through the first prepreg 31. Note, that in this embodiment, the groove portion 29 corresponds to the groove portion 32 of the first prepreg 31, but the present disclosure is not limited to this. The first prepreg 31 may be arranged to cover (close) the groove portion 29 (opening portion) of the bus bar 28.

Here, the sheet-like leakage prevention portion 33 (leakage prevention sheet) is in intimate contact with the entire lower surface of the first prepreg 31 of this embodiment. In this embodiment, the leakage prevention portion 33 is thinner than the first prepreg 31. The leakage prevention portion 33 can be made of various materials such as metal foil including copper foil and aluminum foil, or a film made of synthetic resin including PET (polyethylene terephthalate). A groove portion 34 (opening portion) corresponding to the position of the groove portion 29 is formed and passes through the leakage prevention portion 33. The groove portion 34 extends in a slit shape at a position continuous with the groove portion 29. Note, that the present disclosure is not limited to this. The leakage prevention portion 33 may also be formed to cover (close) the groove portion 29 of the bus bar 28 and the groove portion 32 of the first prepreg 31, without providing the groove portion 34 in the leakage prevention portion 33.

The second prepreg 35 has the same constant thickness as the first prepreg 31, and is formed with substantially the same size as the first prepreg 31. The insertion hole 36 through which the electronic component 24 is inserted is formed in the second prepreg 35. When the semi-cured second prepreg 35 is sandwiched between the insulating substrate 21 and the bus bar 28 and the second prepreg 35 is cured by heating or the like, the insulating substrate 21 and the bus bar 28 are joined and fixed to each other.

Next, the manufacturing method of the electrical junction box 10 will be described.

Figure 3:
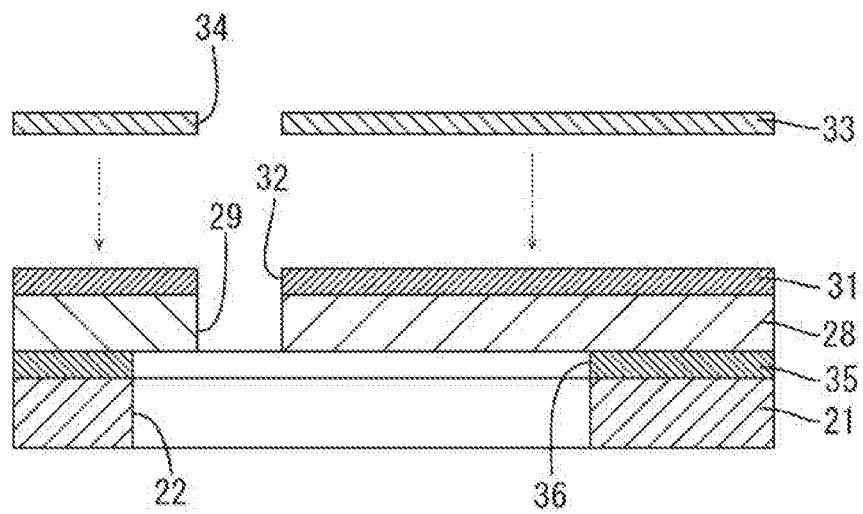
FIG. 3 is a view illustrating a process for attaching a leakage prevention portion to a first prepreg.

The second prepreg 35 is arranged on the bus bar 28 and the insulating substrate 21 is arranged on the second prepreg 35 so that the second prepreg 35 is sandwiched between the insulating substrate 21 and the bus bar 28. Then, as shown in FIG. 3, the first prepreg 31 is overlaid on the surface of the bus bar 28 exposed on the side opposite to the insulating substrate 21. After that, the leakage prevention portion 33 is in intimate contact with the first prepreg 31 by overlaying the leakage prevention portion 33 on the exposed surface of the first prepreg 31.

In this manner, even if the first prepreg 31 is in a semi-cured state and the semi-liquid thermosetting resin or the like is likely to leak, the leakage prevention portion 33 prevents the thermosetting resin or the like impregnated into the first prepreg 31 from leaking, dripping, or the like to the outside. By suppressing dripping (leakage) and the like of the first prepreg 31, it is possible to improve workability such as movement of the circuit board 20, assembly, and the like. Then, the first prepreg 31 and the second prepreg 35 are cured by heating the circuit board 20 in a heating furnace, and the space between the bus bar 28 and the leakage prevention portion 33 and the space between the insulating substrate 21 and the bus bar 28 are to be fixed. Note, that reflow soldering of the electronic component 24 may be performed during the heating.

After the first prepreg 31 and the second prepreg 35 are cured, an adhesive 38 is applied to the upper surface of the heat dissipation member 12, and the circuit board 20 is placed thereon. As the adhesive 38, for example, an adhesive (e.g., an epoxy-based adhesive) that is cured in a short time at a normal temperature (25° C.) or by heating is used. By the adhesive 38 being cured, the circuit board 20 is fixed on the heat dissipation member 12. Then, by the cover 14 being placed on the heat dissipation member 12 and fixed by screwing, the electrical junction box 10 is formed.

According to this embodiment, the following actions and effects are obtained.

The circuit board 20 includes: the bus bar 28; the first prepreg 31 that is overlaid on the bus bar 28; the sheet-like leakage prevention portion 33 that is overlaid on the surface of the first prepreg 31 and suppresses leakage of the first prepreg 31 to the outside.

According to this embodiment, because the circuit board 20 can be formed using, for example, in place of an insulating adhesive for insulating the bus bar 28, the first prepreg 31 that is generally inexpensive and is insulating, the manufacturing cost can be reduced. Here, if the first prepreg 31 is used in place of an insulating adhesive, due to the semi-curing nature of the first prepreg 31, leakage of the semi-liquid resin or the like constituting the first prepreg 31 to the outside is of concern. According to this embodiment, leakage of the first prepreg 31 to the outside can be suppressed by the sheet-like leakage prevention portion 33 being overlaid on the surface of the first prepreg 31. Accordingly, defects due to leakage of the first prepreg 31 can be suppressed while reducing the manufacturing cost.

Also, the leakage prevention portion 33 is overlaid on the surface of the first prepreg 31 opposite to the bus bar 28 side.

In this manner, compared to the configuration in which the leakage prevention portion 33 covers exposed surfaces other than the surface of the first prepreg 31 opposite to the bus bar 28, the configuration according to this embodiment can suppress leakage of the first prepreg 31 in a wide region where leakage of the first prepreg 31 easily occurs.

The circuit board 20 includes: the insulating substrate 21 that is overlaid on the bus bar 28 and has the conduction path; and the second prepreg 35 for joining the insulating substrate 21 and the bus bar 28.

In this manner, by joining the bus bar 28 and the insulating substrate 21 using the second prepreg 35, because the circuit board 20 can be manufactured using the same kind of prepreg for the first prepreg 31 and the second prepreg 35, the number of types of components (members) can be reduced and the manufacturing cost can be reduced.

Other Embodiments

The technique disclosed in this specification is not limited to the embodiment explained in the foregoing description and illustrated in the drawings, and the technical scope of the technique disclosed in this specification encompasses also the following embodiments, for example.

In the above embodiment, the leakage prevention portion 33 is overlaid on the lower surface of the first prepreg 31, but the present disclosure is not limited to this. Leakage of the prepreg may also be suppressed, for example, by a sheet-like leakage prevention portion covering exposed portions of the upper surface of the first prepreg 31 and exposed side faces (side edge portions) of the first prepreg 31.

An adhesive used for fixing the circuit board 20 to the heat dissipation member 12 is not limited to the above adhesive 38, but other adhesives may also be used. Also, a double-sided tape may also be used in place of the adhesive 38. In addition, the circuit board 20 and the bus bar 28 may also be fixed to the heat dissipation member 12 with screws as fixing means. A screw hole through which the shaft portion of a screw passes may pass through the circuit board 20 and the bus bar 28, and the circuit board 20 and the bus bar 28 may also be fixed to the heat dissipation member 12 by screwing. In this case, the adhesive 38 used for adhering the circuit board 20 to the heat dissipation member 12 may also be omitted. Furthermore, a member having good thermal conductivity such as a grease or a heat dissipation sheet may be arranged between the circuit board 20 and the heat dissipation member 12, and the circuit board 20 may also be fixed to the heat dissipation member 12 by fixing means such as screwing.

The shape and the size of the leakage prevention portion 33 are not limited to the shape and the size of the above embodiment, and can be variously changed. The leakage prevention portion 33 may be formed, for example, to be larger than the region of the lower surface of the first prepreg 31, and the outer side of the periphery of the first prepreg 31 may also be covered with the leakage prevention portion 33. In this case, the leakage prevention portion 33 of the outer side of the periphery of the first prepreg 31 may also be pasted on the bus bar 28. In addition, the thickness of the leakage prevention portion 33 may also be changed, for example, a leakage prevention portion having different thicknesses in part may also be used.

The invention claimed is:

1. A circuit board, comprising:
   a bus bar;
   a first prepreg that is overlaid on the bus bar;
   a sheet-like leakage prevention portion that is made of synthetic resin, is overlaid on the surface of the first prepreg, and suppresses leakage of the first prepreg to the outside;
   an electronic component that is connected to the bus bar;
   an insulating substrate that is overlaid on the bus bar and has a conduction path; and
   a second prepreg for joining the insulating substrate and the bus bar,
   wherein a through hole through which the electronic component is inserted is formed in the insulating substrate and the second prepreg.

2. The circuit board according to claim 1, wherein the leakage prevention portion is overlaid on the surface of the first prepreg opposite to the bus bar side.

3. The circuit board according to claim 2, wherein the leakage of the first prepreg to the outside is a dripping of a semi-liquid resin constituting the first prepreg.

4. An electrical junction box, comprising:
   the circuit board according to claim 2; and
   a case for accommodating the circuit board.

5. The circuit board according to claim 1, wherein the leakage of the first prepreg to the outside is a dripping of a semi-liquid resin constituting the first prepreg.

6. An electrical junction box, comprising:
   the circuit board according to claim 5; and
   a case for accommodating the circuit board.

7. An electrical junction box, comprising:
   the circuit board according to claim 1; and
   a case for accommodating the circuit board.

* * * * *